(12) United States Patent
Wang et al.

(10) Patent No.: US 9,437,536 B1
(45) Date of Patent: Sep. 6, 2016

(54) REVERSED BUILD-UP SUBSTRATE FOR 2.5D

(71) Applicant: Invensas Corporation, San Jose, CA (US)

(72) Inventors: Liang Wang, Milpitas, CA (US);
Rajesh Katkar, San Jose, CA (US);
Hong Shen, Palo Alto, CA (US);
Cyprian Emeka Uzoh, San Jose, CA (US); Belgacem Haba, Saratoga, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/885,466

(22) Filed: Oct. 16, 2015

Related U.S. Application Data

(60) Provisional application No. 62/159,136, filed on May 8, 2015.

(51) Int. Cl.
| | | |
|---|---|---|
| *H01L 23/495* | (2006.01) | |
| *H01L 23/498* | (2006.01) | |
| *H01L 21/48* | (2006.01) | |
| *H01L 23/00* | (2006.01) | |

(52) U.S. Cl.
CPC ....... *H01L 23/49838* (2013.01); *H01L 21/486* (2013.01); *H01L 21/4853* (2013.01); *H01L 23/49811* (2013.01); *H01L 24/81* (2013.01)

(58) Field of Classification Search
USPC .......... 257/668, 678–733, 787–796, 257/E23.001–E23.194, E21.499–E21.519; 438/15, 26, 51, 55, 64, 106, 124–127
See application file for complete search history.

(56) References Cited

U.S. PATENT DOCUMENTS

| | | | | |
|---|---|---|---|---|
| 5,847,936 A * | 12/1998 | Forehand | ............... | H05K 1/114 174/250 |
| 6,711,813 B1 * | 3/2004 | Beyne | ................. | H01L 21/4857 216/17 |
| 6,879,034 B1 * | 4/2005 | Yang | ....................... | H01L 21/56 257/678 |
| 7,084,487 B1 * | 8/2006 | Conn | .................... | H01L 23/552 257/660 |
| 8,198,724 B1 * | 6/2012 | Wu | ................... | H01L 23/49822 257/691 |
| 2002/0079591 A1 * | 6/2002 | Sakiyama | ............. | H01L 25/652 257/777 |
| 2011/0126408 A1 * | 6/2011 | Antesberger | ...... | H01L 23/49833 29/831 |
| 2011/0127664 A1 * | 6/2011 | Antesberger | ...... | H01L 23/49833 257/692 |
| 2013/0083583 A1 * | 4/2013 | Crisp | ...................... | H01L 23/13 365/63 |
| 2014/0070423 A1 * | 3/2014 | Woychik | .............. | H01L 21/486 257/774 |

* cited by examiner

*Primary Examiner* — Dao H Nguyen
*Assistant Examiner* — Tram H Nguyen
(74) *Attorney, Agent, or Firm* — Lerner, David, Littenberg, Krumholz & Mentlik, LLP

(57) ABSTRACT

A method of making an assembly can include forming a circuit structure defining front and rear surfaces, and forming a substrate onto the rear surface. The forming of the circuit structure can include forming a first dielectric layer coupled to the carrier. The first dielectric layer can include front contacts configured for joining with contacts of one or more microelectronic elements, and first traces. The forming of the circuit structure can include forming rear conductive elements at the rear surface coupled with the front contacts through the first traces. The forming of the substrate can include forming a dielectric element directly on the rear surface. The dielectric element can have first conductive elements facing the rear conductive elements and joined thereto. The dielectric element can include second traces coupled with the first conductive elements. The forming of the substrate can include forming terminals at a surface of the substrate.

24 Claims, 3 Drawing Sheets

FIG. 1B

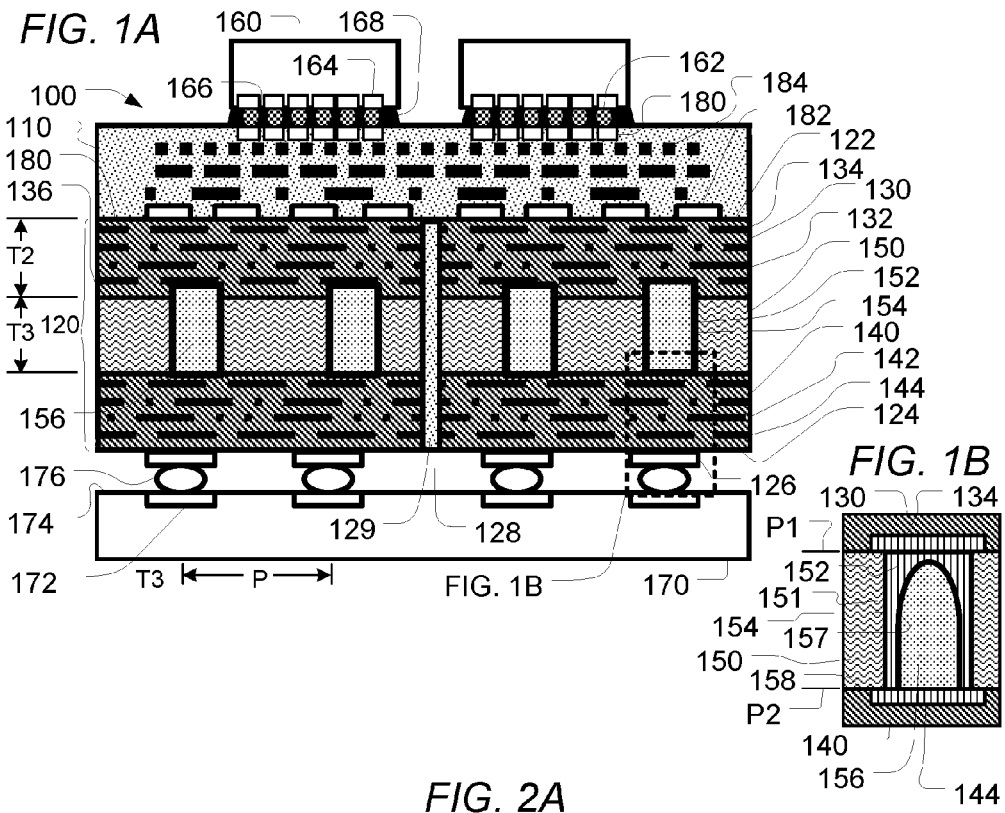
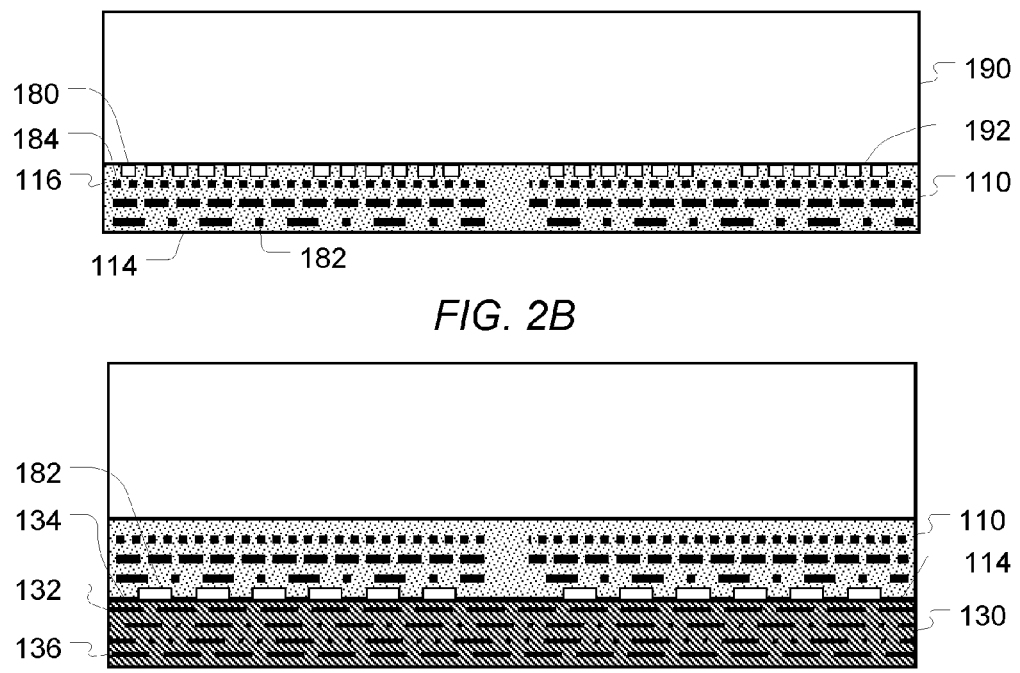

REVERSED BUILD-UP SUBSTRATE FOR 2.5D

CROSS-REFERENCE TO RELATED APPLICATION

The present application claims the benefit of the filing date of U.S. Provisional Patent Application No. 62/159,136 filed May 8, 2015, the disclosure of which is hereby incorporated herein by reference.

BACKGROUND OF THE INVENTION

The present invention relates to microelectronic packaging and elements thereof and more specifically to an assembly for electrically interconnecting and packaging a plurality of microelectronic elements in a common package.

Multi-chip packages that incorporate silicon interposers can be used to provide high speed, high bandwidth or a high degree of parallel interconnections between multiple microelectronic elements arranged side by side above a surface of a common interposer. Silicon interposers are typically formed from a relatively thick wafer in which wiring patterns and contacts are fabricated in a thin layer of the silicon wafer and above the thin layer, after which the bulk of the wafer is ground down or otherwise discarded. As silicon wafers are almost exclusively processed using semiconductor processing equipment in clean rooms, such processing and the discarding of the unneeded bulk wafer can make silicon interposers more expensive and more difficult to fabricate than other types of circuit structures.

In addition, the horizontal area of such multi-chip packages can be large, and may constrain further miniaturization of a system such as smart phone, tablet, phablet or other handheld device, or personal computer in which the multi-chip package is incorporated. Further improvements in the structure and fabrication of multi-chip packages, as well as the horizontal area occupied thereby, would be desirable.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components that form the interconnections should not greatly increase the size of the assembly. Similar needs arise in other applications as, for example, in data servers such as those used in internet search engines, where increased performance and size reduction are needed.

Semiconductor chips containing memory storage arrays, particularly dynamic random access memory chips (DRAMs) and flash memory chips, are commonly packaged in single- or multiple-chip packages and assemblies. Each package has many electrical connections for carrying signals, power, and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds, which extend in both horizontal and vertical directions relative to the surface of the chip.

As manufacturers of smartphones, tablets, and other devices constantly seek increased performance and greater circuit density, the trend for these devices is to provide ever-greater functional capabilities in an amount of space on a circuit panel that may stay the same or may decrease over time. In light of the foregoing, certain improvements can be made in the structure of microelectronic packages and assemblies that comprise a microelectronic package having a memory controller function, or "controller package" as further defined herein. Such improvements may help reduce an amount of space of a circuit panel, e.g., a motherboard, occupied by the controller and memory packages when such controller and memory packages are mounted in close proximity to one another at non-overlapping areas of the circuit panel.

BRIEF SUMMARY OF THE INVENTION

A method of making an assembly can include forming a circuit structure defining oppositely-facing front and rear major surfaces, and forming a substrate onto the rear surface of the circuit structure. One of the front and rear surfaces of the circuit structure can be mechanically coupled to a surface of a carrier. The forming of the circuit structure can include forming a first dielectric layer mechanically coupled to the carrier. The first dielectric layer can define the front surface of the circuit structure.

The first dielectric layer can include front contacts at the front surface configured for joining with corresponding contacts of one or more microelectronic elements, and first conductive traces supported by the first dielectric layer. At least some of the first traces can have maximum widths less than five microns. The forming of the circuit structure can also include forming rear conductive elements at the rear surface electrically coupled with the front contacts through the first traces.

The forming of the substrate can include forming a dielectric element directly on the rear surface of the circuit structure. The dielectric element can have first conductive elements facing the rear conductive elements of the circuit structure and joined thereto. The dielectric element can also include second conductive traces supported by the dielectric element and electrically coupled with the first conductive elements. At least some of the second conductive traces can have maximum widths greater than five microns. The forming of the substrate can also include forming terminals at a surface of the substrate facing away from the rear conductive elements. The terminals can be electrically coupled with the second traces.

In one embodiment, the dielectric element can be a first dielectric element. Forming the substrate can also include forming a substrate core having an upper surface attached to the first dielectric element, a lower surface opposite from the upper surface, and a plurality of electrically conductive interconnects extending therethrough. Forming the substrate can further include forming a second dielectric element attached to the lower surface of the substrate core, and forming third conductive traces supported by the second dielectric element and electrically coupled with the conductive interconnects. The terminals can be formed on or within the second dielectric element and can be electrically coupled with the second traces through the conductive interconnects and the third traces.

In a particular example, at least some of the conductive interconnects can have an upper cross section in a plane of the upper surface of the substrate core, and a lower cross section in a plane of the lower surface of the substrate core. The conductive interconnects can be formed after forming the substrate core by a process including plating an electrically conductive material into open ends of through holes at the lower surface of the substrate core, the through holes extending through the thickness of the substrate core, such that the upper cross section contains a higher amount of the conductive material than the lower cross section.

In an exemplary embodiment, the method can also include, before forming the conductive interconnects, forming at least one of a conductive adhesion layer and a barrier layer extending through the substrate core, the at least one of the conductive adhesion layer and the barrier layer comprising a different material than a bulk conductive material of the conductive interconnects. The conductive interconnects can be formed onto a surface of the at least one of the conductive adhesion layer and the barrier layer. In one example, at least some of the conductive interconnects can include recesses therein. The method can also include depositing a dielectric material into the recesses.

In a particular embodiment, the method can also include, before forming the substrate, planarizing the first dielectric layer. In one embodiment, the forming of the rear conductive elements can include forming a second dielectric layer mechanically coupled with the first dielectric layer, and forming the rear conductive elements at the second dielectric layer. In a particular example, the forming of the rear conductive elements can include forming intermediate conductive traces supported by the second dielectric layer, the rear conductive elements electrically coupled with the first traces through the intermediate traces. In an exemplary embodiment, at least some of the first traces can have maximum widths less than two microns.

In one example, at least some of the second traces can have maximum widths less than ten microns. In a particular embodiment, the method can also include separating the circuit structure from the carrier. In one embodiment, the method can also include, after separating the circuit structure from the carrier, forming electrically conductive bumps at the front surface configured for connection with the contacts of the one or more microelectronic elements, the bumps being formed in contact with the front contacts. In a particular example, the method can also include electrically coupling the one or more microelectronic elements with the bumps, the contacts of the one or more microelectronic elements facing the bumps and joined thereto.

In an exemplary embodiment, the method can also include, before forming the circuit structure, forming a sacrificial dielectric layer having a top surface mechanically coupled to the carrier and defining a bottom surface opposite from the top surface, forming openings at the bottom surface extending into the sacrificial dielectric layer in a direction toward the top surface, and forming electrically conductive bumps within the openings, the bumps configured for connection with the contacts of the one or more microelectronic elements. The front surface of the circuit structure can be formed on the bottom surface of the sacrificial dielectric layer, and the front contacts of the circuit structure can be formed in contact with the bumps. The method can also include, after separating the circuit structure from the carrier, removing the sacrificial dielectric layer to expose the bumps at the front surface of the circuit structure.

In one example, the method can also include electrically coupling the one or more microelectronic elements with the bumps, the contacts of the one or more microelectronic elements facing the bumps and joined thereto. In a particular embodiment, the substrate can have a CTE in a horizontal plane of the substrate, and the method can also include forming a groove within the substrate at least partially extending in a direction transverse to the surface of the substrate, and depositing a material at least partially filling the groove, the material having a CTE in a horizontal plane of the substrate that is lower than the CTE of the substrate.

In one embodiment, the method can also include joining the substrate to a circuit panel having panel contacts at a surface thereof, the terminals of the substrate being electrically coupled with the panel contacts. In a particular example, the method can also include, after separating the circuit structure from the carrier, electrically coupling the one or more microelectronic elements with the front contacts, the contacts of the microelectronic elements facing the front contacts and joined thereto, and separating the assembly into a first assembly including a first plurality of the microelectronic elements and a second assembly including a second plurality of the microelectronic elements.

An assembly can include a circuit structure made of a plurality of dielectric layers and electrically conductive features thereon, the circuit structure having front and rear opposite surfaces and a maximum thickness of less than 30 microns in a direction normal to the front surface. An assembly can also include a substrate defining a first surface laminated onto the rear surface of the circuit structure and a second surface opposite therefrom, the substrate comprising a dielectric element and having terminals at the second surface, the dielectric element defining the first surface.

The electrically conductive features can include front contacts at the front surface configured for joining with corresponding contacts of one or more microelectronic elements, rear conductive elements at the rear surface, and first conductive traces having maximum widths less than five microns, the front contacts electrically coupled with the rear conductive elements through the first traces. The dielectric element can have first conductive elements facing the rear conductive elements and joined thereto, and second conductive traces electrically coupled to the first conductive elements and extending in directions parallel to the first surface, at least some of the second traces having maximum widths greater than five microns.

In an exemplary embodiment, the dielectric element can be a first dielectric element. The substrate can also include a substrate core having an upper surface attached to the first dielectric element, a lower surface opposite from the upper surface, and a thickness in a first direction normal to the upper surface, the substrate core having a plurality of electrically conductive interconnects extending in the first direction through a thickness of the substrate core. The substrate can further include a second dielectric element attached to the lower surface of the substrate core and having third conductive traces electrically coupled with the conductive interconnects, a surface of the second dielectric element defining the second surface of the substrate. The terminals can be electrically coupled with the second traces through the conductive interconnects and the third traces.

In one example, at least some of the conductive interconnects can have an upper cross section in a plane of the upper surface of the substrate core and a lower cross section in a plane of the lower surface of the substrate core, and the upper cross section can contain a higher amount of conductive material than the lower cross section. In a particular embodiment, the substrate core can have at least one of a conductive adhesion layer and a barrier layer extending circumferentially around the conductive interconnects and extending through the substrate core. The at least one of the conductive adhesion layer and the barrier layer can comprise a different material than a bulk conductive material of the conductive interconnects.

In one embodiment, the rear surface of the circuit structure can be united with the first surface of the substrate, and the interface between the circuit structure and the substrate can be devoid of solder. In a particular example, a first subset of the first traces can be disposed closer to the front surface of the circuit structure and can have maximum widths less than five microns, and a second subset of the first traces can be disposed closer to the rear surface of the circuit structure and can have maximum widths greater than five microns. In an exemplary embodiment, the first subset of the first traces can have maximum widths less than two microns. In one example, at least some of the second traces can have maximum widths greater than ten microns.

In a particular embodiment, the front contacts can comprise a plurality of bumps at the front surface of the circuit structure. In one embodiment, the assembly can also include the one or more microelectronic elements electrically coupled with the front contacts of the circuit structure, the contacts of the one or more microelectronic elements facing the front contacts and joined thereto. In a particular example, the substrate can have a CTE in a horizontal plane of the substrate, and the substrate can include a groove at least partially extending in a direction transverse to the second surface, the groove being at last partially filled with a material having a CTE in a horizontal plane of the substrate that is lower than the CTE of the substrate.

In an exemplary embodiment, the assembly can also include a circuit panel having panel contacts at a surface thereof, the substrate being joined with the circuit panel, the terminals of the substrate being electrically coupled with the panel contacts. In one example, a system can include the assembly as described above and one or more other electronic components electrically connected with the assembly. In a particular embodiment, the system can also include a housing, the assembly and the one or more other electronic components being assembled with the housing.

BRIEF DESCRIPTION OF THE DRAWINGS

FIG. 1A depicts a side sectional view illustrating a multichip package in accordance with an embodiment of the invention.

FIG. 1B is an enlarged side sectional view illustrating a portion of the package of FIG. 1A.

FIGS. 2A-2H are side sectional views illustrating stages of fabrication in accordance with the embodiment depicted in FIG. 1A.

DETAILED DESCRIPTION

Figure 2C:
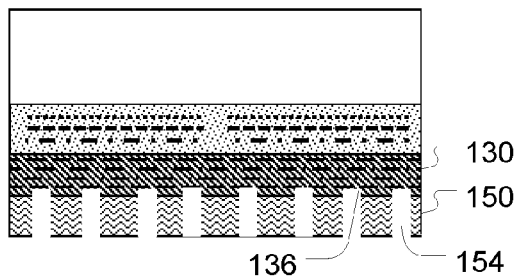

As used in this disclosure with reference to a substrate or a dielectric layer, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate.

A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature. As used herein, a statement that one surface or element is located at a "constant" height above or below another surface or element means constant within manufacturing tolerances, e.g., ±10% over the area of a completed single interconnection element.

As illustrated in FIG. 1A, an assembly 100 can include a circuit structure 110 having a front surface 112 and a rear surface 114 opposite from the front surface. The assembly 100 can also include a substrate 120 defining a first surface 122 laminated onto the rear surface 114 of the circuit structure 110, a second surface 124 opposite from the first surface, and terminals 126 at the second surface. The substrate 120 can comprise first and second dielectric elements 130, 140 attached to a substrate core 150.

The assembly 100 can be joined to and electrically interconnected with one or more microelectronic elements 160 that can be mounted to the front surface of the circuit structure 110. The assembly 100 can be joined to and electrically interconnected with a circuit panel 170, the terminals 126 of the assembly being electrically coupled to panel contacts 172 at a major surface 174 of the circuit panel by conductive bond material 176, for example, with the major surface of the circuit panel confronting the second surface 124 of the substrate 120.

In FIG. 1A, the directions parallel to the front and rear surfaces 112, 114 of the circuit structure 110 are referred to herein as "horizontal" or "lateral" directions, whereas the directions perpendicular to the front and rear surfaces are referred to herein as upward or downward directions and are also referred to herein as the "vertical" directions. The directions referred to herein are in the frame of reference of the structures referred to. Thus, these directions may lie at any orientation to the normal or gravitational frame of reference.

The circuit structure 110 can comprise or can be made of a plurality of thin dielectric layers 116 stacked one atop another, and electrically conductive features thereon such as bumps 162 and front contacts 180 at the front surface 112, rear conductive elements 182 at the rear surface 114, and conductive traces 184 electrically coupling the front contacts with the rear conductive elements. In one example, the circuit structure 110 can have a maximum thickness T1 of less than 10 microns in a direction normal to the front surface 112 of the circuit structure. In a particular example, the circuit structure 110 can have a maximum thickness T1 of less than 30 microns in a direction normal to the front surface 112 of the circuit structure.

The dielectric material of the dielectric layers 116 can be a material that can be deposited and patterned to form structures that support metallization thereon at a pitch of less than 5 microns, less than 2 microns, less than 1 micron, or at least as low as 0.2 microns. In one embodiment, each dielectric layer 116 can be planarized before depositing the next dielectric layer.

The dielectric layers 116 may be made of silicon dioxide, silicon nitride, or polyimide, for example. In particular examples, the dielectric material can be a photosensitive polymer, e.g., benzocyclobutene ("BCB") based material, or other photosensitive material. In particular examples, the dielectric material can be deposited by chemical vapor deposition ("CVD"), spray coating, spin coating, roller coating, slot die coating, dipping, or the like. In particular examples, a self-planarizing dielectric material can be deposited to form one or more of the dielectric layers, such material having a tendency to form a flattened or flat upper surface as compared to topography that may be present in features underlying the upper surface.

With the circuit structure 110 comprising or being made of dielectric layers rather than semiconductor material, and omitting semiconductor material as a primary material supporting the electrically conductive features, advantages for cost of the circuit structure, simplified fabrication, lower signal loss at high operating frequencies, and other advantages can be obtained as described below.

The electrically conductive features of the circuit structure 110 can provide electrical interconnection between the microelectronic elements 160 and the assembly 100. The electrically conductive features of the circuit structure 110 also can provide chip-to-chip electrical interconnectivity among the microelectronic elements 160.

The electrically conductive features including the bumps 162, the front contacts 180, the rear conductive elements 182, and the conductive traces 184 can be made of an electrically conductive material, for example, a metal such as copper, aluminum, nickel, gold, or the like. In one example, the bumps 162 can comprise an electrically conductive bond material such as solder, tin, indium, copper, gold, a eutectic composition or combination thereof, another joining material such as a conductive paste or a conductive adhesive, and/or an electrically conductive composition that includes a metal component such as metal particles or flakes and a polymeric component. Such bumps can be deposited onto the front contacts 180.

In a particular embodiment, the conductive bond material of the bumps 162 can include an electrically conductive matrix material such as described in U.S. patent application Ser. Nos. 13/155,719 and 13/158,797, the disclosures of which are hereby incorporated herein by reference. In a particular embodiment, the conductive bond material of the bumps 162 can have a similar structure or be formed in a manner as described therein. In some examples, suitable materials for the conductive bond material of the bumps 162 can include polymers filled with conductive material in particle form such as metal-filled polymers, including, for example, metal-filled epoxy, metal-filled thermosetting polymers, metal-filled thermoplastic polymers, or electrically conductive inks.

Alternatively, the bumps 162 can comprise posts or pins, or stud bumps or bond via interconnects each formed of extruded wire, such bumps projecting to heights thereof from the front surface 112, and can be joined with element contacts 164 of the microelectronic elements 160 at such heights with a electrically conductive bond material such as those described above, for example.

The front contacts 180 of the circuit structure can be configured for flip-chip connection with a plurality of element contacts 164 at front surfaces 166 of one or more microelectronic elements 160 overlying different portions of an area of the front surface 112 of the circuit structure 110. Stated another way, the front contacts 180 are configured to be joined with the corresponding element contacts 164, as through electrically conductive bumps 162, in a state in which the front contacts 180 of the assembly 100 are juxtaposed with, i.e., face the corresponding element contacts 164 of the microelectronic elements 160.

The conductive traces 184 on the circuit structure 110 may have their smallest pitch and their smallest line and space dimensions at positions that are closer to the front surface 112 of the circuit structure than the rear surface 114. Thus, conductive traces 184 of the circuit structure 110 that are disposed closer to the rear surface 114 may have maximum widths greater than maximum widths of the conductive traces that are disposed closer to the front surface 112. At least some of the conductive traces 184 can have maximum widths less than five microns, less than 2 microns, less than 1 micron, or at least as low as 0.2 microns.

In one example, the circuit structure 110 can provide pitch conversion between the substrate 120 and the front contacts 180 configured to connect to element contacts 164 of the microelectronic elements 160. In such an example, the conductive traces 184 adjacent to the front surface 112 may have a pitch between centers of adjacent conductive traces of about 2 microns, to approximately match the pitch between centers of adjacent element contacts 164. The conductive traces 184 adjacent to the rear surface 114 may have a pitch between centers of adjacent conductive traces of about 10 microns, to approximately match the pitch between centers of adjacent first conductive elements 134 at the first surface 122 of the substrate 120.

The substrate 120 can comprise first and second dielectric elements 130, 140 defining respective oppositely-facing first and second major surfaces (122, 124) of the substrate and a substrate core 150 disposed between the first and second dielectric elements 130, 140 and extending parallel to the major surfaces. The first dielectric element 130 can be made of a plurality of dielectric layers 132 and electrically conductive features thereon. Such electrically conductive features can be first conductive elements 134, and conductive traces 136 electrically coupled to the first conductive elements and extending in directions parallel to the first surface 122.

Thus, the first dielectric element 130 can define the first major surface 122 of the substrate 120 and can be laminated or deposited directly onto the rear surface 114 of the circuit structure 110. The first dielectric element 130 in some cases can have a thickness T2 of 20 microns to 2 millimeters in a direction normal to the first surface 122. As can be seen in FIG. 1A, the interface between the circuit structure 110 and the substrate 120 can be devoid of solder. The dielectric material of the dielectric layers 132 can be a material that can be deposited and patterned to form structures that support metallization thereon at a pitch of greater than 5 microns, greater than 10 microns, greater than 15 micron, or at least as great as 20 microns.

The dielectric layers 132 may be made of an organic material or a polymer-based material, for example. In a particular example, the dielectric layers 132 can be reinforced by glass or semiconductor particles, rods, or other such structure embedded within the dielectric material, which can be of or include any or all of resin, epoxies, thermosetting plastics or thermoplastics, polyimide, polycarbonate, polytetra-fluoroethylene ("PTFE"), polymethyl methacrylate ("PMMA"), low K dielectric materials, e.g., porous dielectric materials, low glasses, ceramics, or other materials. In particular examples, the dielectric layers 132 can be of FR 4 or BT resin construction.

The first dielectric element 130 may have a single-metal layer or multiple-metal layer structure. The first dielectric element 130 can include the first conductive elements 134 at the first surface 122 facing and joined to the rear conductive elements 182 of the circuit structure 110. The first conductive elements 134 can be deposited partially in contact with portions of the rear conductive elements 182. The first conductive elements 134 and the conductive traces 136 can be made of an electrically conductive material, for example, a metal such as copper, nickel, gold, or the like.

The conductive traces 136 on the first dielectric element 130 may have their smallest pitch and their smallest line and space dimensions at positions that are closer to the first surface 122 of the substrate than the substrate core 150. Thus, conductive traces 136 of the first dielectric element 130 that are disposed closer to the substrate core 150 may have maximum widths greater than maximum widths of the conductive traces that are disposed closer to the first surface 122. At least some of the conductive traces 136 can have maximum widths greater than 5 microns, greater than 10 microns, greater than 15 microns, or at least as great as 20 microns.

In one example, the first dielectric element 130 can provide pitch conversion between the circuit structure 110 and the substrate core 150. In such an example, the conductive traces 136 adjacent to the first surface 122 may have a pitch between centers of adjacent conductive traces of about 10 microns, to approximately match the pitch between centers of adjacent rear conductive elements 182. The conductive traces 136 adjacent to the substrate core 150 may have a pitch between centers of adjacent conductive traces of about 100 microns, to approximately match the pitch between centers of adjacent conductive interconnects 152 of the substrate core.

The substrate core 150 can have electrically conductive features extending through a thickness of the substrate core, in the form of a plurality of conductive interconnects 152. In the embodiment of FIG. 1A, the conductive interconnects 152 can extend within a corresponding plurality of through openings 154 extending through the thickness of the substrate core 150. The substrate core 150 in some cases can have a thickness T3 of 0.1 to 5 millimeters in a direction normal to the first surface 122 of the substrate 120. The pitch P between centers of adjacent ones of the conductive interconnects 152 can be about 100 microns, or can be greater than 100 microns.

The conductive interconnects 152 can electrically couple the conductive features of the first dielectric element 130 with the conductive features of the second dielectric element 140. For example, the conductive interconnects 152 can electrically couple the conductive traces 136 with conductive traces 144 of the second dielectric element 140. The conductive interconnects 152 can each have a recess 157 extending therein from a surface 158 of the substrate core 150, and the recess can be filled with a fill material 156 that can be one or more dielectric materials or one or more electrically conductive materials.

As can be seen in FIG. 1B, at least some of the conductive interconnects 152 can have an asymmetric structure. At least some of the conductive interconnects 152 can have an upper cross section in a plane P1 of an upper surface of the substrate core adjacent to the dielectric element, and a lower cross section in a plane P2 of a lower surface of the substrate core opposite from the upper surface, and the upper cross section can contain a higher amount of the conductive material of the conductive interconnects than the lower cross section.

Also, at least some of the conductive interconnects 152 can have an asymmetric adhesion and/or barrier layer 151 between an exposed surface of the through openings 154 and the conductive interconnects 152. The adhesion and/or barrier materials of the adhesion and/or barrier layer 151 can comprise a different material than a bulk conductive material of the conductive interconnects 152, and the conductive interconnects can be deposited onto a surface of the adhesion and/or barrier layer within the through openings 154.

At least some of the adhesion and/or barrier layers 151 of the conductive interconnects 152 can have an upper cross section in a plane P1 of an upper surface of the substrate core adjacent to the dielectric element, and a lower cross section in a plane P2 of a lower surface of the substrate core opposite from the upper surface, the upper cross sections of both the conductive interconnects and the adhesion and/or barrier layer can be filled with the bulk conductive material and the adhesion and/or barrier materials, and the lower cross sections of both the conductive interconnects and the adhesion and/or barrier layer can define an opening (e.g., the recess 157) extending therethrough.

The second dielectric element 140 can be made of a plurality of dielectric layers 142 and electrically conductive features thereon. The dielectric material of the dielectric layers 142 can be a material that can be deposited and patterned to form structures that support metallization thereon at a pitch of greater than 5 microns, greater than 100 microns, greater than 200 microns, or at least as great as 240 microns. The dielectric layers 142 may be made of the same materials described above with reference to the dielectric layers 132 of the first dielectric element 130.

The second dielectric element 140 may have a single-metal layer or multiple-metal layer structure. The second dielectric element 140 can define the second major surface 124 of the substrate 120, and can include the terminals 126 at the second surface, and conductive traces 144 joined to the conductive interconnects 152 of the substrate core 150. The conductive traces 144 can be deposited partially in contact with portions of the conductive interconnects 152. The terminals 126 and the conductive traces 144 can be made of an electrically conductive material, for example, a metal such as copper, nickel, gold, or the like.

The conductive traces 144 on the second dielectric element 140 may have their smallest pitch and their smallest line and space dimensions at positions that are closer to the substrate core 150 than the second surface 124 of the substrate. Thus, conductive traces 144 of the second dielectric element 140 that are disposed closer to the second surface 124 of the substrate 120 may have maximum widths greater than maximum widths of the conductive traces that are disposed closer to the substrate core 150. At least some of the conductive traces 144 can have maximum widths greater than 5 microns, greater than 100 microns, greater than 200 microns, or at least as great as 240 microns.

In one example, the second dielectric element 140 can provide pitch conversion between the substrate core 150 and the circuit panel 170. In such an example, the conductive traces 144 adjacent to the substrate core 150 may have a pitch between centers of adjacent conductive traces of about 100 microns, to approximately match the pitch between centers of adjacent conductive interconnects 152. The conductive traces adjacent to the second surface 124 of the substrate 120 may have a pitch between centers of adjacent conductive traces of about 240 microns, to approximately match the pitch between centers of adjacent panel contacts 172 of the circuit panel 170.

In a particular embodiment, the assembly 100 can include a groove 128 at least partially extending in a direction transverse to the second surface 124. As shown in FIG. 1A, the groove 128 extends in a direction perpendicular to the second surface 124, between the second surface and the first surface 122. In other embodiments, the groove 128 can extend partially through the substrate 120 in a direction from the second surface 124 toward the first surface 122.

The groove 128 can be at least partially filled with a dielectric material 129 having a low coefficient of thermal expansion ("CTE") in a horizontal plane of the substrate 120 parallel to the second surface 124. As shown in FIG. 1A, the dielectric material 129 completely fills the groove 128. The dielectric material 129 can have a CTE in a horizontal plane of the substrate 120 that is lower than an effective CTE of the substrate 120 in a horizontal plane of the substrate.

As seen in FIG. 1A, the microelectronic elements 160 can be spaced apart from one another in one or more directions parallel to the front surface 112 of the circuit structure 110, such that the faces of adjacent microelectronic elements do not overlap and there is some space, which can be small, separating the closest edges of adjacent microelectronic elements from one another.

However, in another example (not shown), one or more of the microelectronic elements 160 having contact-bearing faces at a greater height from the front surface 112 than one or more others of the microelectronic elements, can partially overlap the one or more other microelectronic elements. For example, the microelectronic elements can be arranged and interconnected with the circuit structure in a manner such as seen in commonly-owned U.S. Pat. No. 8,952,516 to Zohni et al., the disclosure of which is incorporated by reference herein.

An encapsulant 168 can be provided between the front surface 112 of the circuit structure 110 and the front surfaces 166 of the microelectronic elements 160, reinforcing the connections therebetween through the bumps 162. Such encapsulant can be an underfill material for mechanically reinforcing connections between the circuit structure 110 and the microelectronic elements 160 through the bumps 162.

The material of the encapsulant most typically has a composition different from the composition of the dielectric layers of the circuit structure 110, the first and second dielectric elements 130, 140, and the substrate core 150. In particular embodiments, the encapsulant material can be an epoxy-based polymer system with fillers, overmold, or potting compound. Such compound can provide stiffness to the assembly 100 to withstand internal differential thermal expansion between the assembly 100 and the microelectronic elements 160. The compound may in some cases provide protection from shorting and moisture and/or water resistance.

A method of fabrication will now be described in accordance with FIGS. 2A-2H. Referring to FIG. 2A, the circuit structure 110 can be fabricated by depositing a dielectric layer 116 and electrically conductive features such as the front contacts 180 and the conductive traces 184 over a surface 192 of a carrier 190 on which a release layer may be provided.

The carrier 190 typically is a flat plate-like element of ceramic, glass, or semiconductor composition, or in some cases, an overmold material. The carrier 190 may have a coefficient of thermal expansion of less than 12 parts per million per degree Celsius ("ppm/° C.") in a horizontal plane of the carrier parallel to the surface 192.

The process can be performed so as to form a plurality of dielectric layers 116 and electrically conductive features such as described above with reference to FIG. 1A. Typically, features, e.g., conductive traces 184 having finest pitch or finest line and space widths (e.g., less than 5 microns), are formed first and closest to a surface of the carrier, after which conductive traces having pitch or line and space widths larger than the finest pitch and line/space widths are formed.

The first one of the dielectric layers 116 to be formed can include the front contacts 180 at the front surface 112 of the circuit structure 110. The last one of the dielectric layers 116 to be formed can include rear conductive elements 182 at the rear surface 114 of the circuit structure 110. The rear conductive elements 182 can be electrically coupled to the front contacts 180 by the conductive traces 184. The rear conductive elements 182 can be configured to be joined with electrically conductive features of the first dielectric element 130.

Next, as shown in FIG. 2B, the first dielectric element 130 can be fabricated by depositing a dielectric layer 132 and electrically conductive features directly on the rear surface 114 of the circuit structure 110. The electrically conductive features can include the first conductive elements 134 and the conductive traces 136. The first conductive elements 134 can be deposited in contact with the rear conductive elements 182 of the circuit structure 110, and the conductive traces 136 can be deposited in contact with the first conductive elements 134.

The process can be performed so as to form a plurality of dielectric layers 132 and electrically conductive features such as described above with reference to FIG. 1A. Typically, features, e.g., conductive traces 136 having finest pitch or finest line and space widths (e.g., greater than 5 microns), are formed first and closest to the rear surface 114 of the circuit structure 110, after which conductive traces having pitch or line and space widths larger than the finest pitch and line/space widths (e.g., about 100 microns) are formed.

Then, as can be seen in FIG. 2C, the substrate core 150 having through openings 154 can be united with the first dielectric element 130 such that portions of the conductive traces 136 are exposed within the through openings. The substrate core 150 can be united with the first dielectric element 130 with a dielectric adhesive material, for example.

Figure 2D:
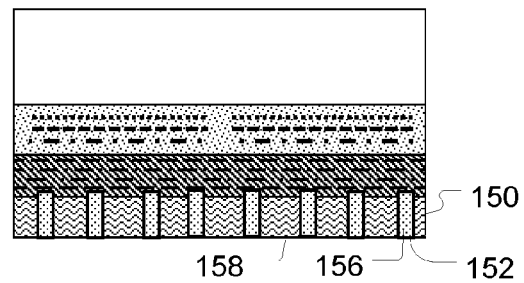

Next, as shown in FIG. 2D, the conductive interconnects 152 can be formed within the through openings 154, extending through the thickness of the substrate core. In one example, the conductive interconnects can be plated into the through openings 154. The conductive interconnects 152 can be deposited in contact with the portions of the conductive traces 136 that are exposed within the through openings 154.

In one example, a conductive adhesion and/or barrier layer 151 (FIG. 1B) can be formed on surfaces of the substrate core 150 exposed within the through openings 154, and the conductive interconnects can be deposited onto exposed surfaces of the adhesion and/or barrier layer. In a particular embodiment, the conductive interconnects 152 can include the adhesion and/or barrier layer 151. The conductive interconnects 152 can each have a recess extending therein from an exposed surface 158 of the substrate core 150, and the recess can be filled with a fill material 156 that can be one or more dielectric materials or one or more electrically conductive materials.

Figure 2E:
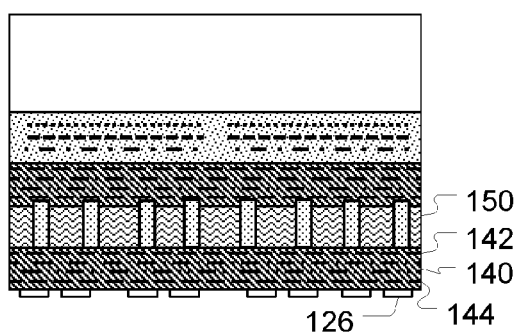

Then, as shown in FIG. 2E, the second dielectric element 140 can be fabricated by depositing a dielectric layer 142 and electrically conductive features directly on the exposed surface 158 (FIG. 2D) of the substrate core 150. The electrically conductive features can include the conductive traces 144 and the terminals 126. Portions of the conductive traces 144 can be deposited in contact with the conductive interconnects 152, and the terminals 126 can be deposited in contact with the conductive traces 144.

The process can be performed so as to form a plurality of dielectric layers 142 and electrically conductive features such as described above with reference to FIG. 1A. Typically, features, e.g., conductive traces 144 having finest pitch or finest line and space widths (e.g., about 100 microns), are formed first and closest to the substrate core 150, after which conductive traces having pitch or line and space widths larger than the finest pitch and line/space widths (e.g., about 240 microns) are formed.

Figure 2F:
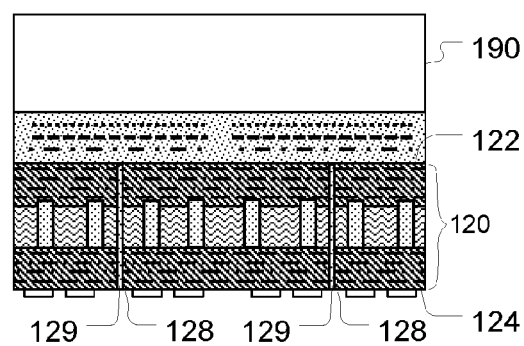

Next, as can be seen in FIG. 2F, grooves 128 can be formed extending from the second surface 124 toward the first surface 122 of the substrate 120 in a direction transverse to the second surface. In particular examples, the grooves 128 can be formed by one or more of etching, drilling, and laser ablation. Each groove 128 can be filled with a low-CTE dielectric material 129.

Figure 2G:
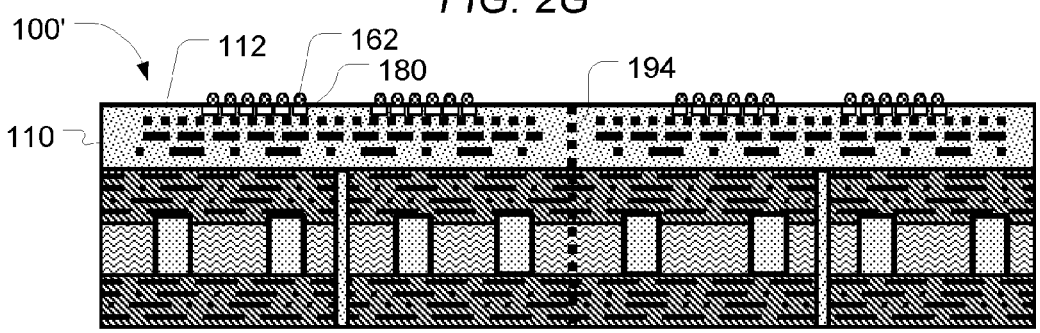
Figure 2H:
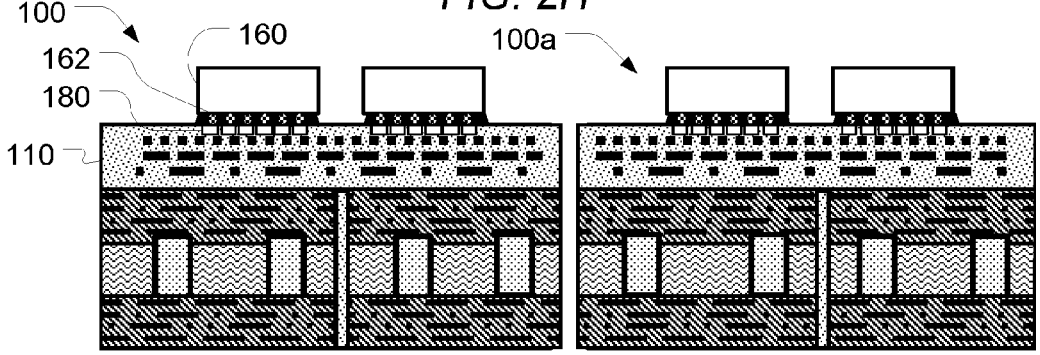

Referring to FIG. 2G, the carrier 190 (FIG. 2F) can then be separated from an in process assembly 100' that may include an in-process circuit structure having dimensions greater than the dimensions of an individual assembly 100 seen in FIG. 1A. In particular embodiments, the carrier can be separated from the in-process assembly 100' by mechanical, optically or chemically-assisted dissolution of a release layer disposed therebetween. Alternatively, the carrier can be abraded from a side opposite the in-process assembly 100' until the in-process structure is released therefrom. Thereafter, bumps 162 can be applied to the front contacts 180 at the front surface 112 of the circuit structure 110.

In time, the microelectronic elements 160 can be united with the front contacts 180 of the circuit structure 110 by the bumps 162 extending between the microelectronic elements and the front contacts, and the encapsulant 168 can then be introduced into spaces between the microelectronic elements and the front surface 112 of the circuit structure. Either before or after assembly of the microelectronic elements 160 thereon, the in-process assembly 100' can be severed along dicing lanes 194 (FIG. 2G) to singulate the in-process assembly into individual assemblies 100 and 100a.

Referring again to FIG. 1A, the assembly 100 can be attached to a circuit panel 170 or another external component. The terminals 126 of the assembly can be electrically coupled to the panel contacts 172 by a conductive bond material 176, for example, with the major surface 174 of the circuit panel confronting the second surface 124 of the assembly.

Figure 3A:
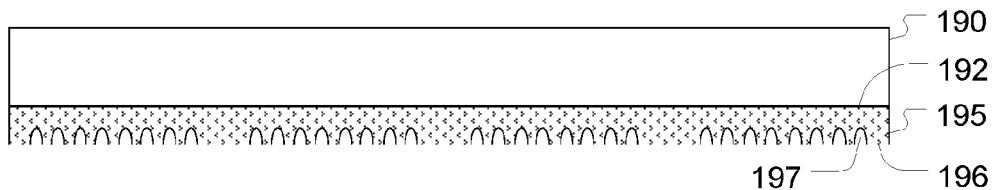
FIGS. 3A-3D are side sectional views illustrating potential alternative stages of fabrication in accordance with the embodiment depicted in FIG. 1A.

An alternative method of fabrication of the assembly 100 will now be described in accordance with FIGS. 3A-3D. Referring to FIG. 3A, a sacrificial dielectric layer 195 can be deposited onto a surface 192 of a carrier 190 on which a release layer may be provided. A mask pattern can be applied to a surface 196 of the dielectric layer 195, with openings where it is desired to deposit bumps 162. The dielectric layer 195 can be etched, for example, to form a plurality of recesses 197 extending from the surface 196 in a direction toward the surface 192 of the carrier 190.

Figure 3B:
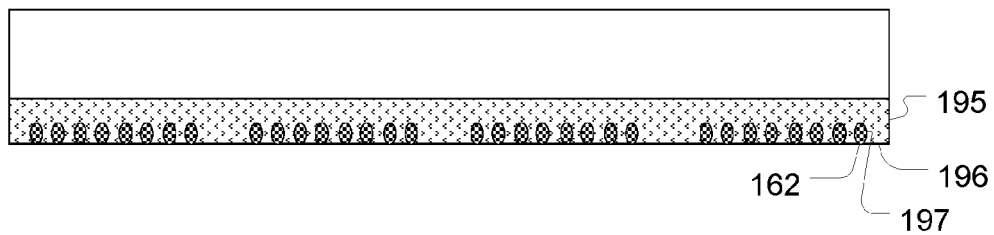
Figure 3C:
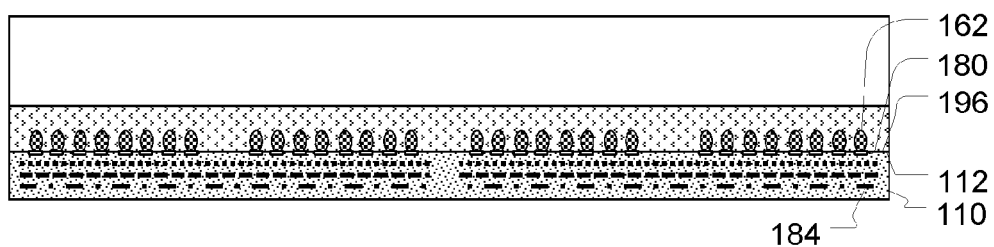

As can be seen in FIG. 3B, the bumps 162 can be deposited into the recesses 197 at the surface 196 of the dielectric layer 195. Next, as shown in FIG. 3C, the circuit structure 110 can be fabricated by depositing a dielectric layer 116 and electrically conductive features such as the front contacts 180 and the conductive traces 184 on the surface 196 of the dielectric layer 195. The front contacts 180 can be deposited onto the surface 196 of the dielectric layer 195 in contact with the bumps 162.

Figure 3D:
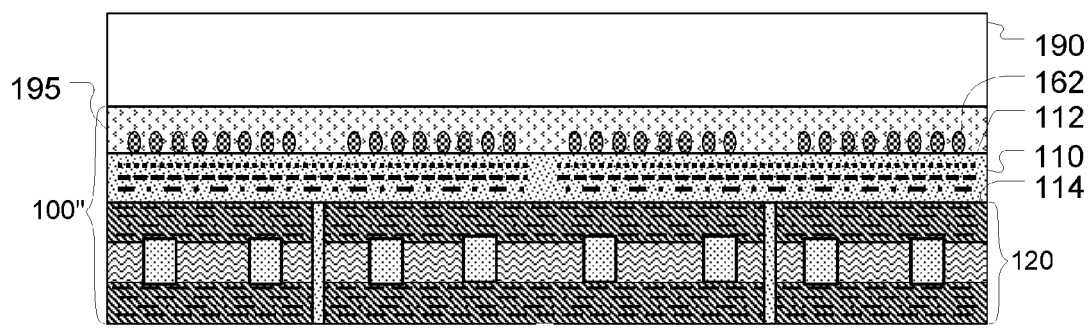

Then, as can be seen in FIG. 3D, the substrate 120 can be formed onto the rear surface 114 of the circuit structure 110, as described above with reference to FIGS. 2B-2F. Next, the carrier 190 can then be separated from an in-process assembly 100" that may include an in-process circuit structure having dimensions greater than the dimensions of an individual assembly 100 seen in FIG. 1A.

Then, the dielectric layer 195 can be removed (e.g., by etching), leaving the bumps 162 exposed at the front surface 112 of the circuit structure 110. The resulting in-process assembly 100' can be seen in FIG. 2G. Next, the in-process assembly 100' can undergo the same steps described above with reference to FIGS. 2G, 2H, and 1A to produce the assembly 100 shown in FIG. 1A.

Figure 4:
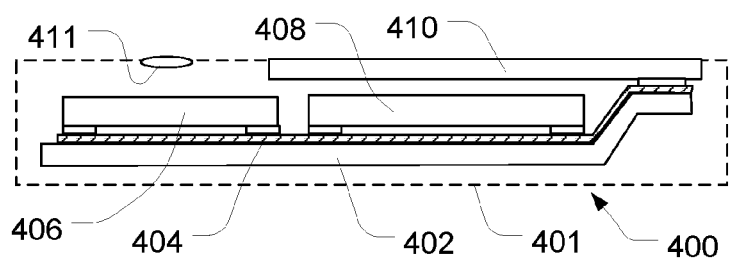
FIG. 4 is a schematic depiction of a system according to one embodiment of the invention.

The interconnection elements described above with reference to FIGS. 1A through 3D above can be utilized in construction of diverse electronic systems, such as the system 400 shown in FIG. 4. For example, the system 400 in accordance with a further embodiment of the invention includes a plurality of modules or components 406 such as the assembly 100 described above, in conjunction with other electronic components 408, 410 and 411.

In the exemplary system 400 shown, the system can include a circuit panel, motherboard, or riser panel 402 such as a flexible printed circuit board, and the circuit panel can include numerous conductors 404, of which only one is depicted in FIG. 4, interconnecting the modules or components 406, 408, 410 with one another. Such a circuit panel 402 can transport signals to and from each of the interconnection elements, microelectronic packages and/or microelectronic assemblies included in the system 400. However, this is merely exemplary; any suitable structure for making electrical connections between the modules or components 406 can be used.

In the example depicted in FIG. 4, the component 408 is a semiconductor chip and component 410 is a display screen, but any other components can be used in the system 400. Of course, although only two additional components 408 and 411 are depicted in FIG. 4 for clarity of illustration, the system 400 can include any number of such components.

Modules or components 406 and components 408 and 411 can be mounted in a common housing 401, schematically depicted in broken lines, and can be electrically interconnected with one another as necessary to form the desired circuit. The housing 401 is depicted as a portable housing of the type usable, for example, in a cellular telephone or personal digital assistant, and screen 410 can be exposed at the surface of the housing. In embodiments where a component 406 includes a light-sensitive element such as an imaging chip, a lens 411 or other optical device also can be provided for routing light to the structure. Again, the simplified system shown in FIG. 4 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A method of making an assembly, comprising:
forming a circuit structure defining oppositely-facing front and rear major surfaces, one of the front and rear surfaces being mechanically coupled to a surface of a carrier, the forming of the circuit structure including:
forming a first dielectric layer mechanically coupled to the carrier, the first dielectric layer defining the front surface, the first dielectric layer including front contacts at the front surface configured for joining with corresponding contacts of one or more microelectronic elements, and first conductive traces supported by the first dielectric layer, at least some of the first traces having maximum widths less than five microns, and
forming rear conductive elements at the rear surface electrically coupled with the front contacts through the first traces;
forming a substrate onto the rear surface of the circuit structure, the forming of the substrate including:
forming a dielectric element directly on the rear surface of the circuit structure, the dielectric element having first conductive elements facing the rear conductive elements of the circuit structure and joined thereto, the dielectric element further including second conductive traces supported by the dielectric element and electrically coupled with the first conductive elements, at least some of the second conductive traces having maximum widths greater than five microns, and
forming terminals at a surface of the substrate facing away from the rear conductive elements, the terminals electrically coupled with the second traces.

2. The method as claimed in claim 1, wherein the dielectric element is a first dielectric element, and forming the substrate further comprises:
forming a substrate core having an upper surface attached to the first dielectric element, a lower surface opposite from the upper surface, and a plurality of electrically conductive interconnects extending therethrough; and
forming a second dielectric element attached to the lower surface of the substrate core, and forming third conductive traces supported by the second dielectric element and electrically coupled with the conductive interconnects, wherein the terminals are formed on or within the second dielectric element and are electrically coupled with the second traces through the conductive interconnects and the third traces.

3. The method as claimed in claim 2, wherein at least some of the conductive interconnects have an upper cross section in a plane of the upper surface of the substrate core, and a lower cross section in a plane of the lower surface of the substrate core, and the conductive interconnects are formed after forming the substrate core by a process comprising:
plating an electrically conductive material into open ends of through holes at the lower surface of the substrate core, the through holes extending through the thickness of the substrate core, such that the upper cross section contains a higher amount of the conductive material than the lower cross section.

4. The method as claimed in claim 3, further comprising, before forming the conductive interconnects, forming at least one of a conductive adhesion layer and a barrier layer extending through the substrate core, the at least one of the conductive adhesion layer and the barrier layer comprising a different material than a bulk conductive material of the conductive interconnects, wherein the conductive interconnects are formed onto a surface of the at least one of the conductive adhesion layer and the barrier layer.

5. The method as claimed in claim 3, wherein at least some of the conductive interconnects include recesses therein, the method further comprising depositing a dielectric material into the recesses.

6. The method as claimed in claim 1, further comprising, before forming the substrate, planarizing the first dielectric layer.

7. The method as claimed in claim 1, wherein the forming of the rear conductive elements includes forming a second dielectric layer mechanically coupled with the first dielectric layer, and forming the rear conductive elements at the second dielectric layer.

8. The method as claimed in claim 1, wherein the forming of the rear conductive elements includes forming intermediate conductive traces supported by the second dielectric layer, the rear conductive elements electrically coupled with the first traces through the intermediate traces.

9. The method as claimed in claim 1, wherein at least some of the first traces have maximum widths less than two microns.

10. The method as claimed in claim 1, wherein at least some of the second traces have maximum widths less than ten microns.

11. The method as claimed in claim 1, further comprising separating the circuit structure from the carrier.

12. The method as claimed in claim 11, further comprising, after separating the circuit structure from the carrier, forming electrically conductive bumps at the front surface configured for connection with the contacts of the one or more microelectronic elements, the bumps being formed in contact with the front contacts.

13. The method as claimed in claim 12, further comprising electrically coupling the one or more microelectronic elements with the bumps, the contacts of the one or more microelectronic elements facing the bumps and joined thereto.

14. The method as claimed in claim 1, further comprising:
before forming the circuit structure,
forming a sacrificial dielectric layer having a top surface mechanically coupled to the carrier and defining a bottom surface opposite from the top surface,
forming openings at the bottom surface extending into the sacrificial dielectric layer in a direction toward the top surface, and
forming electrically conductive bumps within the openings, the bumps configured for connection with the contacts of the one or more microelectronic elements,
wherein the front surface of the circuit structure is formed on the bottom surface of the sacrificial dielectric layer, and the front contacts of the circuit structure are formed in contact with the bumps; and after separating the circuit structure from the carrier, removing the sacrificial dielectric layer to expose the bumps at the front surface of the circuit structure.

15. The method as claimed in claim 14, further comprising electrically coupling the one or more microelectronic elements with the bumps, the contacts of the one or more microelectronic elements facing the bumps and joined thereto.

16. The method as claimed in claim 1, wherein the substrate has a CTE in a horizontal plane of the substrate, the method further comprising forming a groove within the substrate at least partially extending in a direction transverse to the surface of the substrate, and depositing a material at least partially filling the groove, the material having a CTE in a horizontal plane of the substrate that is lower than the CTE of the substrate.

17. The method as claimed in claim 11, further comprising, after separating the circuit structure from the carrier:
  electrically coupling the one or more microelectronic elements with the front contacts, the contacts of the microelectronic elements facing the front contacts and joined thereto; and
  separating the assembly into a first assembly including a first plurality of the microelectronic elements and a second assembly including a second plurality of the microelectronic elements.

18. An assembly, comprising:
  a circuit structure made of a plurality of dielectric layers and electrically conductive features thereon, the circuit structure having front and rear opposite surfaces and a maximum thickness of less than 30 microns in a direction normal to the front surface,
    the electrically conductive features comprising front contacts at the front surface configured for joining with corresponding contacts of one or more microelectronic elements, rear conductive elements at the rear surface, and first conductive traces having maximum widths less than five microns, the front contacts electrically coupled with the rear conductive elements through the first traces; and
  a substrate defining a first surface laminated onto the rear surface of the circuit structure and a second surface opposite therefrom, the substrate comprising a dielectric element and having terminals at the second surface, the dielectric element defining the first surface,
    the dielectric element having first conductive elements facing the rear conductive elements and joined thereto, and second conductive traces electrically coupled to the first conductive elements and extending in directions parallel to the first surface, at least some of the second traces having maximum widths greater than five microns.

19. The assembly as claimed in claim 18, wherein the dielectric element is a first dielectric element, the substrate further including:
  a substrate core having an upper surface attached to the first dielectric element, a lower surface opposite from the upper surface, and a thickness in a first direction normal to the upper surface, the substrate core having a plurality of electrically conductive interconnects extending in the first direction through a thickness of the substrate core; and
  a second dielectric element attached to the lower surface of the substrate core and having third conductive traces electrically coupled with the conductive interconnects, a surface of the second dielectric element defining the second surface of the substrate, wherein the terminals are electrically coupled with said second traces through the conductive interconnects and the third traces.

20. The assembly as claimed in claim 19, wherein at least some of the conductive interconnects have an upper cross section in a plane of the upper surface of the substrate core and a lower cross section in a plane of the lower surface of the substrate core, and the upper cross section contains a higher amount of conductive material than the lower cross section.

21. The assembly as claimed in claim 20, wherein the substrate core has at least one of a conductive adhesion layer and a barrier layer extending circumferentially around the conductive interconnects and extending through the substrate core, the at least one of the conductive adhesion layer and the barrier layer comprising a different material than a bulk conductive material of the conductive interconnects.

22. The assembly as claimed in claim 18, wherein the rear surface of the circuit structure is united with the first surface of the substrate, and the interface between the circuit structure and the substrate is devoid of solder.

23. A system comprising the assembly as claimed in claim 18 and one or more other electronic components electrically connected with the assembly.

24. The system as claimed in claim 23, further comprising a housing, the assembly and the one or more other electronic components being assembled with the housing.

* * * * *